(12) United States Patent
Robin et al.

(10) Patent No.: US 12,062,643 B2
(45) Date of Patent: Aug. 13, 2024

(54) ELECTRONIC DEVICE

(71) Applicant: Aledia, Echirolles (FR)

(72) Inventors: Ivan-Christophe Robin, Grenoble (FR); Zine Bouhamri, Villeurbanne (FR); Philippe Gilet, Teche (FR)

(73) Assignee: Aledia, Echirolles (FR)

( * ) Notice: Subject to any disclaimer, the term of this patent is extended or adjusted under 35 U.S.C. 154(b) by 568 days.

(21) Appl. No.: 17/287,971

(22) PCT Filed: Oct. 8, 2019

(86) PCT No.: PCT/EP2019/077264
§ 371 (c)(1),
(2) Date: Apr. 22, 2021

(87) PCT Pub. No.: WO2020/083638
PCT Pub. Date: Apr. 30, 2020

(65) Prior Publication Data
US 2021/0375834 A1    Dec. 2, 2021

(30) Foreign Application Priority Data

Oct. 24, 2018   (FR) ........................................ 1871290

(51) Int. Cl.
H01L 21/78     (2006.01)
H01L 25/075    (2006.01)
(Continued)

(52) U.S. Cl.
CPC ........ H01L 25/0753 (2013.01); H01L 33/005 (2013.01); H01L 33/62 (2013.01); *H01L 2933/0066* (2013.01)

(58) Field of Classification Search
CPC ....... H01L 33/00; H01L 33/62; H01L 33/005; H01L 33/0093; H01L 27/15;
(Continued)

(56) References Cited

U.S. PATENT DOCUMENTS 6,420,244 B2 * 7/2002 Lee .......................... H01L 24/96
                                                       438/113
10,658,240 B1 * 5/2020 Iriguchi .................. H01L 24/09
(Continued)

FOREIGN PATENT DOCUMENTS

JP    2016-076705 A    5/2016
WO    2016/007175 A1   1/2016

OTHER PUBLICATIONS

International Search Report and Written Opinion for International Application No. PCT/EP2019/077264, mailed Jan. 16, 2020.
(Continued)

*Primary Examiner* — Chuong A Luu
(74) *Attorney, Agent, or Firm* — Wolf, Greenfield & Sacks, P.C.

(57) ABSTRACT

A method for manufacturing an electronic device including the following steps: a) forming a wafer of electronic chips; b) fixing the wafer of electronic chips to a first support made
(Continued)

of a stretchable material; c) removing and/or etching the wafer; and d) stretching the first support so as to move the chips away from one another.

20 Claims, 13 Drawing Sheets

(51) Int. Cl.
*H01L 33/00* (2010.01)
*H01L 33/62* (2010.01)

(58) Field of Classification Search
CPC ..... H01L 27/156; H01L 25/16; H01L 25/167; H01L 25/075; H01L 25/0753; H01L 21/52; H01L 21/683; H01L 21/6835; H01L 2221/68336; H01L 2221/68331; H01L 2221/68368; H01L 2933/0066; H01L 21/56; H01L 21/78; H01L 21/561; H01L 21/565; H01L 21/6836; H01L 23/495
USPC .......................................................... 257/99
See application file for complete search history.

(56) References Cited

U.S. PATENT DOCUMENTS

| | | | |
|---|---|---|---|
| 2002/0025656 A1* | 2/2002 | Arai | H01L 21/67132 |
| | | | 257/E21.599 |
| 2008/0073757 A1* | 3/2008 | Kummerl | H01L 23/3107 |
| | | | 257/E23.116 |
| 2010/0029023 A1* | 2/2010 | Neff | H01L 33/46 |
| | | | 257/E33.056 |
| 2010/0112783 A1* | 5/2010 | Nakamura | C09J 183/08 |
| | | | 438/458 |
| 2015/0249069 A1 | 9/2015 | Yoshida et al. | |
| 2016/0322283 A1 | 11/2016 | McMahon et al. | |
| 2017/0077007 A1 | 3/2017 | Suthiwongsunthorn et al. | |

OTHER PUBLICATIONS

Preliminary Search Report for French Application No. 1871290, dated Aug. 6, 2019.
International Preliminary Report on Patentability for International Application No. PCT/EP2019/077264, mailed May 6, 2021.

* cited by examiner

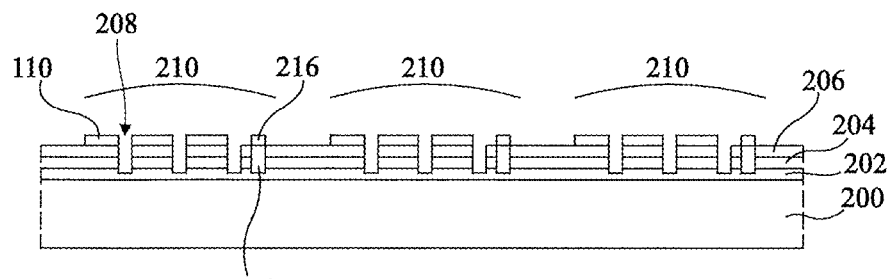
2A
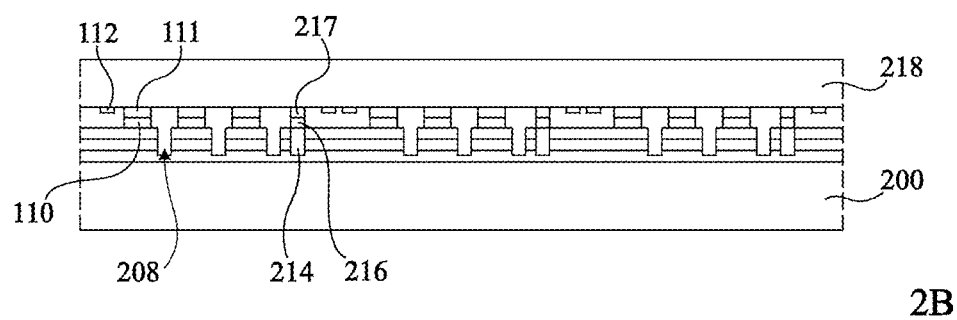
2B
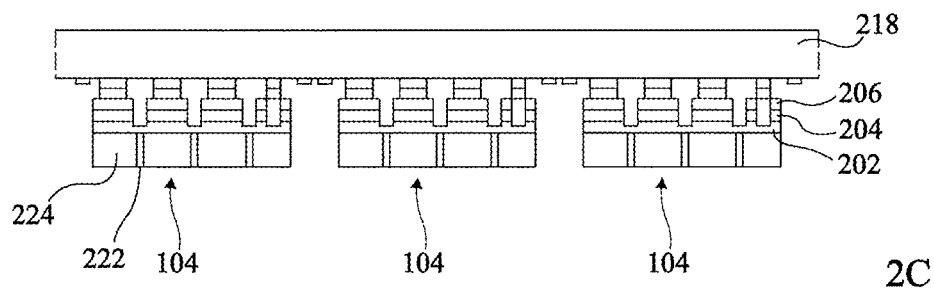
2C
Fig 2

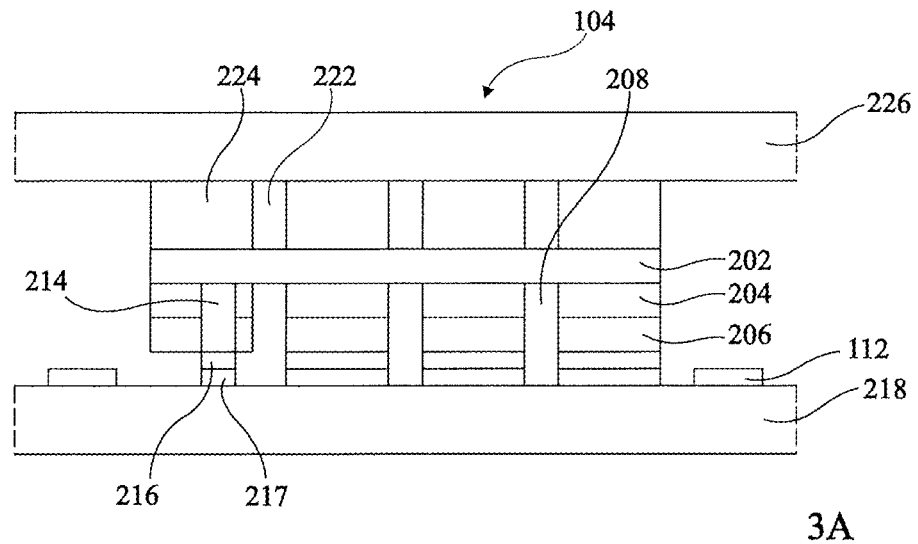
3A
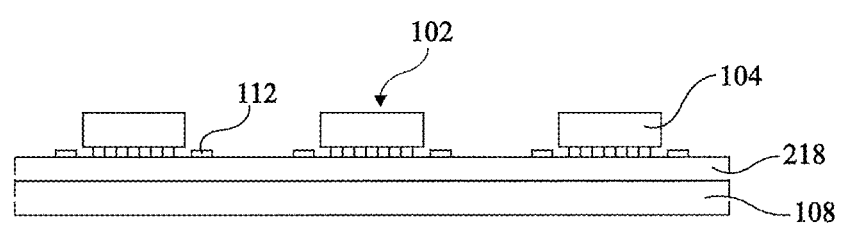
3B
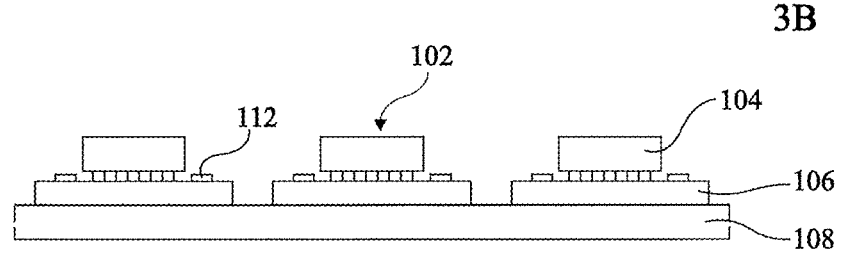
3C
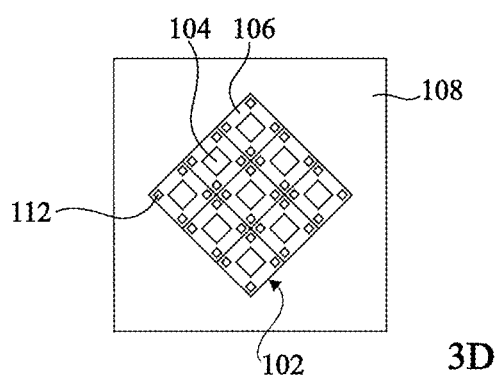
3D  Fig 3

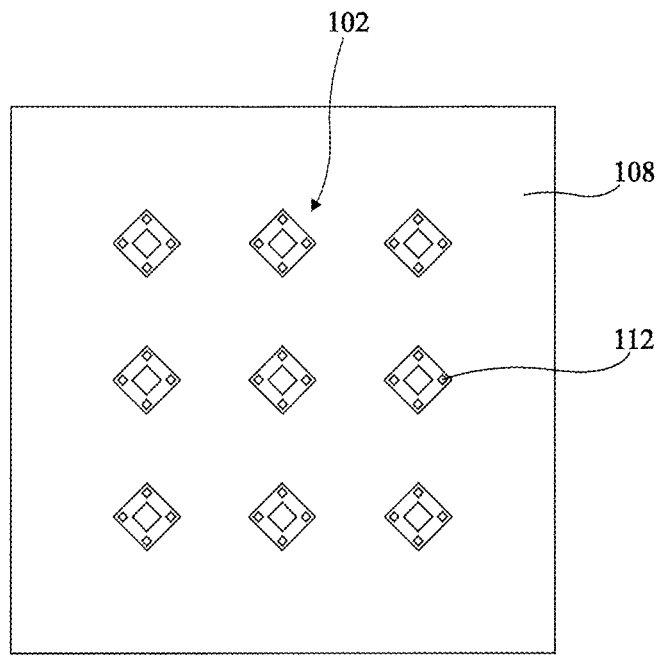
4A
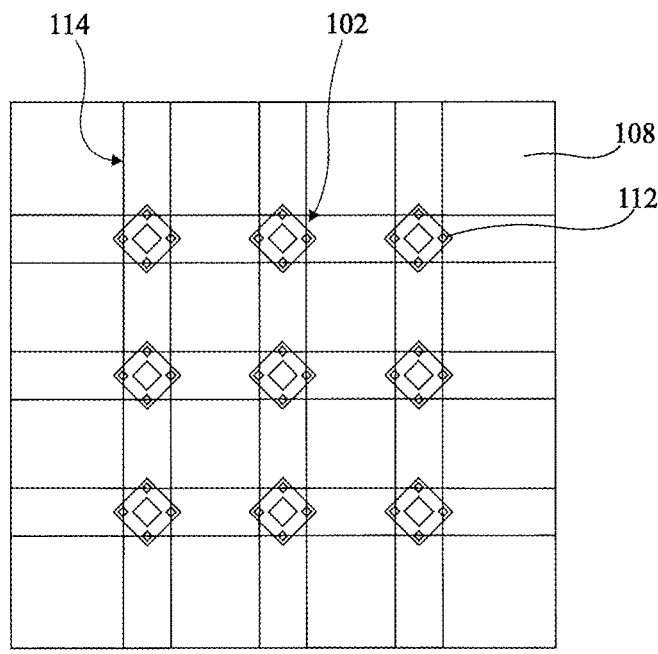
4B
Fig 4

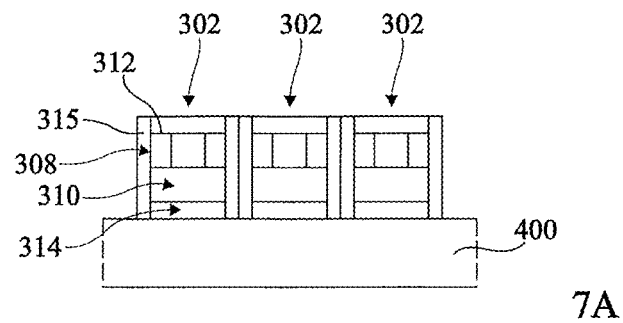
7A
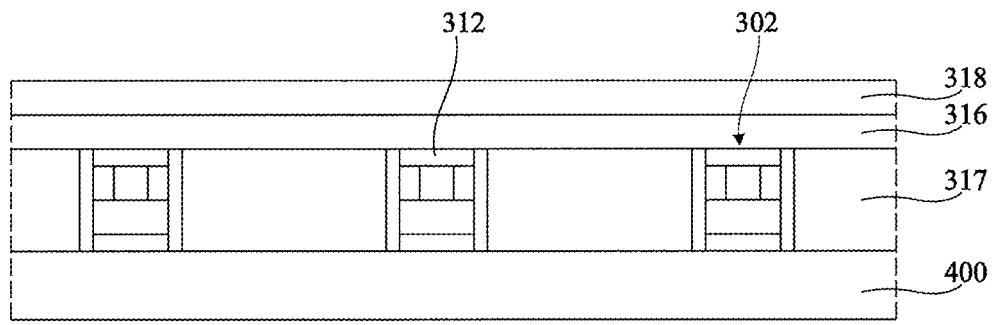
7B
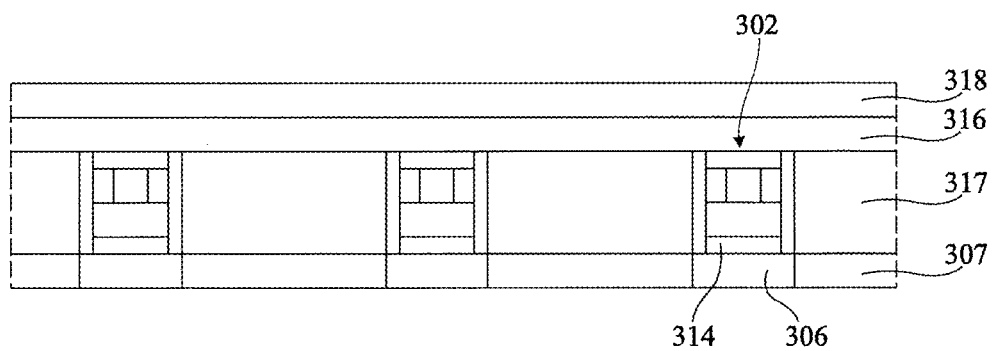
7C
Fig 7

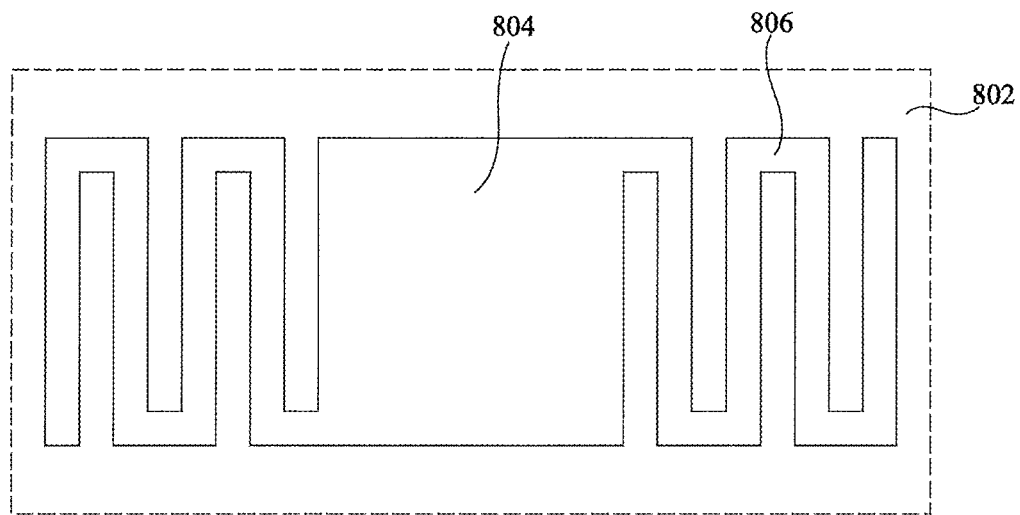
10A
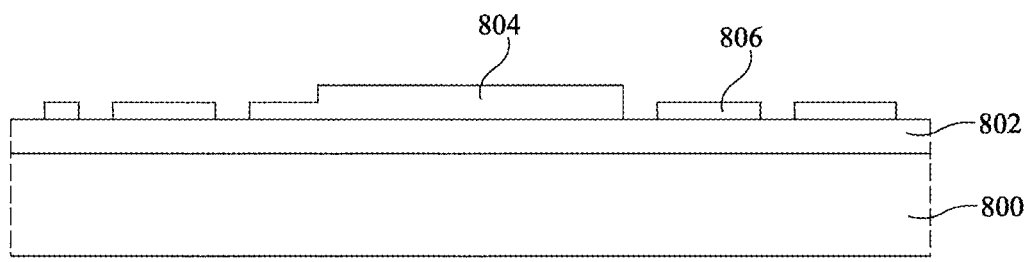
10B
Fig 10

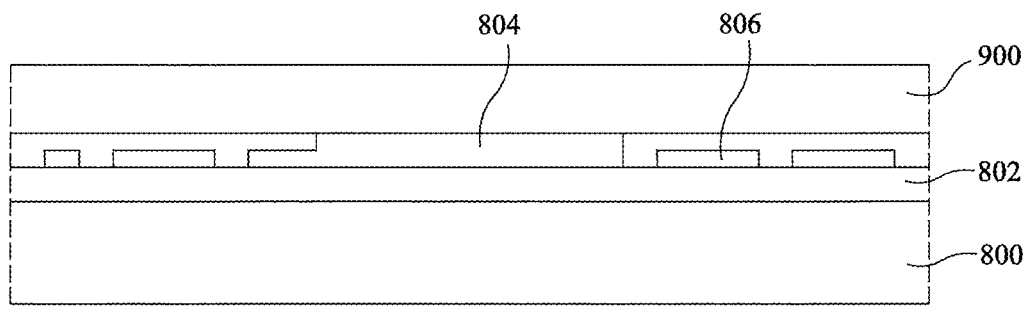
11A
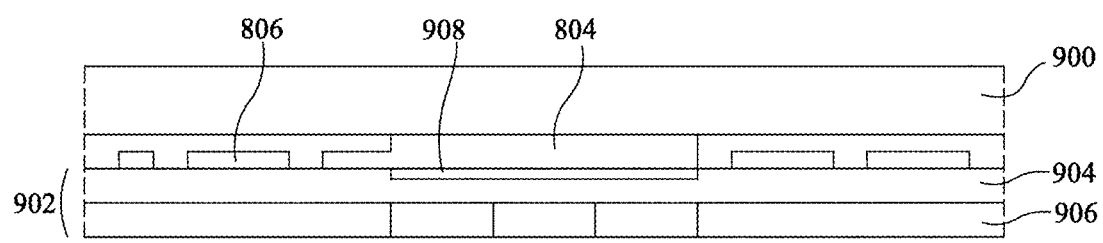
11B
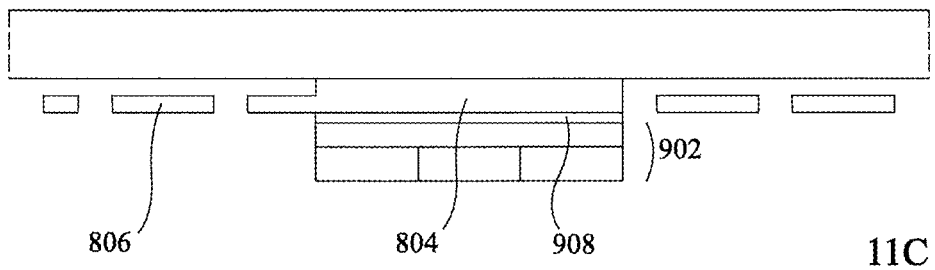
11C
Fig 11

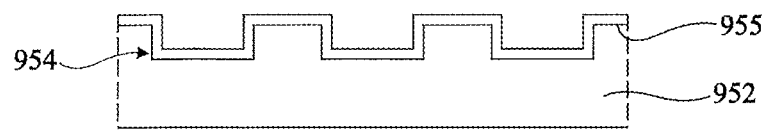
13A
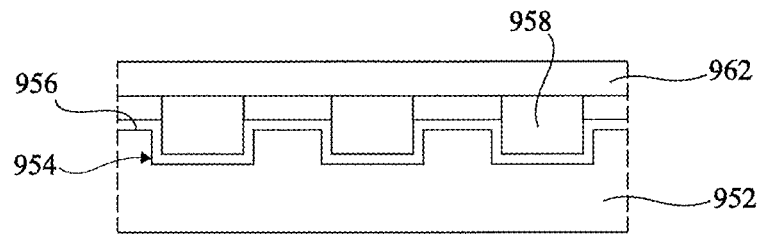
13B
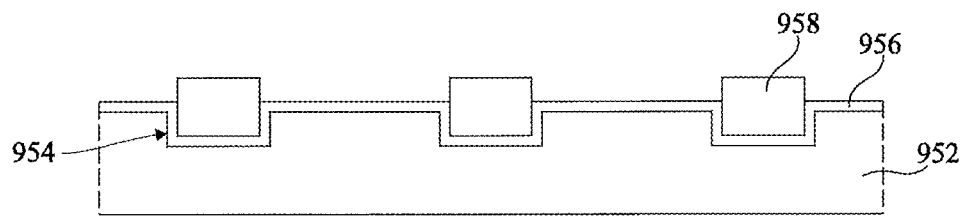
13C
Fig 13

ELECTRONIC DEVICE

This application is a national stage filing under 35 U.S.C. § 371 of International Patent Application Serial No. PCT/EP2019/077264, filed Oct. 8, 2019, which claims priority to French patent application FR18/71290, filed Oct. 24, 2018. The contents of these applications are incorporated herein by reference in their entirety.

TECHNICAL FIELD

The present disclosure relates to electronic devices comprising a plurality of electronic chips and methods for their manufacture.

BACKGROUND ART

Electronic devices comprising a plurality of similar electronic chips exist. These chips can be spaced apart from one another and arranged in an array. For example, display screens comprise a plurality of display pixels formed in a similar manner. The manufacture of such devices can comprise a step of placement according to a technique called "Pick and Place" during which each individualised display pixel is deposited at the desired location separately from the others. This technique can be long and expensive when there is a high number of display pixels.

SUMMARY OF INVENTION

One object of an embodiment is to address all or some of the drawbacks of the electronic devices and the methods for their manufacture described in the foregoing.

Thus, one embodiment provides a method for manufacturing an electronic device comprising the following steps:
  a) forming a wafer of electronic chips;
  b) fixing the wafer of electronic chips to a first support made of a stretchable material;
  c) removing and/or etching the wafer; and
  d) stretching the first support so as to move the chips away from one another.

According to an embodiment, the method comprises, before step b), a step of forming first conductive elements on the first support.

According to an embodiment, the first conductive elements are stretchable and/or deformable.

According to an embodiment, the formation of the first conductive elements comprises the following steps:
  forming a conductive layer on a substrate;
  etching the conductive layer so as to form the first conductive elements, the first conductive elements comprising pads and strips in a zigzag pattern, each strip being in contact with at least one pad; and
  transferring the pads and the strips onto the first support so that the strips are not in contact with the first support.

According to an embodiment, the thickness of the strips is less than the thickness of the pads.

According to an embodiment, the method comprises, before step b), the formation of cavities in the first support, each chip being located in one of the cavities after step b).

According to an embodiment, the method comprises the formation of second conductive elements on the side of the chips opposite the first support and/or above the chips.

According to an embodiment, the formation of the second conductive elements is carried out after step d).

According to an embodiment, the method comprises a step, after step d), of transferring chips from the first support onto a second support.

According to an embodiment, each electronic chip comprises an optoelectronic circuit and an electronic circuit adapted to control the optoelectronic circuit.

According to an embodiment, each electronic chip only comprises two external electronic connection terminals.

According to an embodiment, the method comprises the following steps subsequent to step d):
  e) forming, on the side of the light-emitting face, conductive elements, substantially transparent to the radiation emitted by the chips so as to interconnect lines of chips;
  f) transferring the chips onto a third support substantially transparent to the radiation emitted by the chips;
  g) removing the first support;
  h) forming conductive layers so as to interconnect columns of chips.

According to an embodiment, the transfer onto the second support is carried out after step h).

According to an embodiment, the first support comprises first conductive elements forming lines, each chip being connected, in step b), to one of the conductive elements.

According to an embodiment, second conductive elements forming columns are formed on the face of the chips opposite the first support.

A further embodiment provides an electronic device obtained by the method as described in the foregoing, wherein the electronic chips are located on the conductive elements, the conductive elements lying on the first support made of a stretchable material in a stretched state.

According to an embodiment, each electronic chip is a display pixel.

According to an embodiment, the device corresponds to a display screen.

According to an embodiment, each electronic chip comprises a conductive pad electrically connected to the conductive element lying on the first support.

According to an embodiment, the conductive elements are stretchable and/or deformable.

According to an embodiment, each electronic chip is located at least partially in a cavity of the support.

BRIEF DESCRIPTION OF THE DRAWINGS

The foregoing features and advantages, as well as others, will be described in detail in the following description of specific embodiments given by way of illustration and not limitation with reference to the accompanying drawings, in which:

FIG. 2 depicts steps of an embodiment of a method for manufacturing the electronic device shown in FIG. 1;

FIG. 3 depicts further steps of an embodiment of a method for manufacturing the electronic device shown in FIG. 1;

FIG. 4 depicts further steps of an embodiment of a method for manufacturing the electronic device shown in FIG. 1;

FIG. 7 depicts steps of an embodiment of a method for manufacturing the electronic device shown in FIG. 5;

FIG. 10 depicts steps of an embodiment of a method for manufacturing conductive elements;

FIG. 11 depicts steps of an embodiment of a method for manufacturing conductive elements;

FIG. 13 depicts steps of an embodiment of a method for manufacturing the electronic device shown in FIG. 12.

DESCRIPTION OF EMBODIMENTS

Like features have been designated by like references in the various figures. In particular, the structural and/or functional features that are common among the various embodiments may have the same references and may have identical structural, dimensional and material properties.

For the sake of clarity, only the operations and elements that are useful for an understanding of the described embodiments herein have been illustrated and described in detail.

Unless indicated otherwise, when reference is made to two elements that are connected together, this means a direct connection without any intermediate elements other than conductors, and when reference is made to two elements that are linked or coupled together, this means that these two elements can be connected or be linked or coupled by way of one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

The terms "isolating" and "conductive" are considered here to signify respectively "electrically isolating" and "electrically conductive".

A display pixel of an image corresponds to the basic element of the image displayed by an optoelectronic device. When the optoelectronic device is a colour-image display screen, it comprises, in general, for the display of each image-display pixel, at least three components, also called display sub-pixels, which each emit a light radiation substantially in a single colour (for example red, green and blue). The superposition of the radiation emitted by these three display sub-pixels provides the observer with a colour sensation corresponding to the pixel displaying the displayed image. In this case, the unit formed by the three display sub-pixels used for the display of an image-displaying pixel is called a display pixel of the optoelectronic device.

Figure 1:
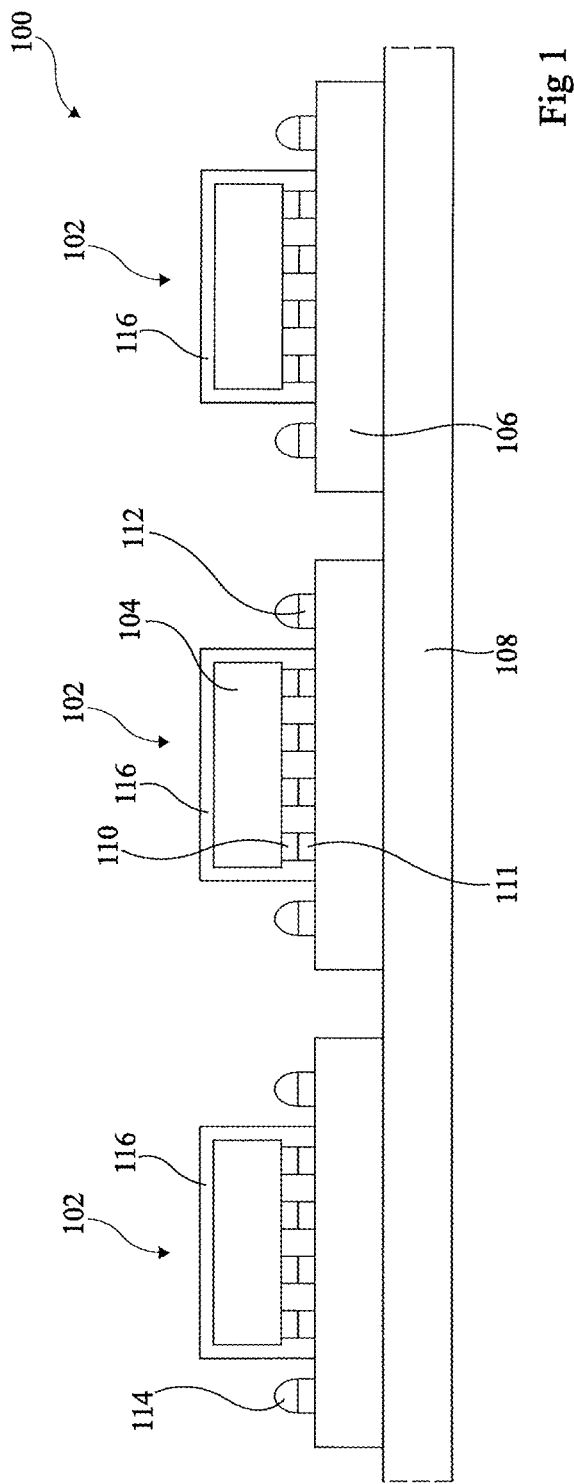
FIG. 1 illustrates a partial and schematic sectional view of an embodiment of an electronic device.

FIG. 1 is a partial and schematic sectional view illustrating an embodiment of an electronic device 100. The electronic device 100 comprises a plurality of electronic chips 102 disposed on a support 108 made of a stretchable material, three chips being illustrated in FIG. 1. The device 100 is, for example, a display screen in which the chips are display pixels 102.

Each display pixel 102 comprises an optoelectronic circuit 104 and an electronic circuit 106. Each optoelectronic circuit 104 comprises, for example, a plurality of display sub-pixels, for example three, the display sub-pixels emitting, for example, radiation in different wavelength ranges. Each electronic circuit 106 corresponds, for example, to an integrated circuit chip and comprises, for example, a control circuit for controlling the display sub-pixels of the optoelectronic circuit 104. The circuits 104 and 106 are connected by conductive pads 110 of the optoelectronic circuit 104 and conductive pads 111 of the electronic circuit 106. The conductive pads 110 and 111 are, for example, in relief, as shown in FIG. 1, or can be flush with the face of the circuits 104 and 106 so that the circuits 104 and 106 are bonded by direct heterogeneous bonding. The electronic circuit 106 additionally comprises additional conductive pads 112 not directly connected to the optoelectronic circuit 104. For example, each display pixel 102 comprises four additional pads 112. Conductive elements 114, for example conductive strips, extend over the support 108 and over the electronic circuits 106, in particular in contact with the pads 112. The conductive strips 114 can connect a plurality of display pixels together. Each display pixel 102 can receive electronic signals, in particular control and/or supply signals, by way of the conductive elements 114 and the pads 112.

For each display pixel 102, an isolating coating 116 covers the optoelectronic circuit 104 and the conductive pads 110 and 111.

The support 108 is made of a stretchable material, for example of a material comprised in the group comprising the materials mentioned in the U.S. Pat. Nos. 4,222,913 and 4,379,197, polyethylene resins with no vinyl acetate-polymerized groups, acrylate polymers such as the following components: 2-ethylhexyl acrylate, n-butyl acrylate, methyl acrylate and t-butyl methacrylate. A stretchable material is defined as a material the longitudinal deformation modulus of which, i.e. the ratio between the stress and the relative elongation, is comprised between 102 Pa and 106 Pa. Preferably, the support 108 is adapted to be deformed with an elongation at the breaking point greater than 150%, preferably greater than 300%. The support 108 is, for example, made of a stretchable isolating material.

The stretchable support 108 of the electronic device 100 is preferably in a stretched state, i.e. tensile forces are exerted, or have been exerted, on the support so that the surface area of the stretched support, when viewed from above, corresponds to between 150% and 10000% of the surface area of the same support 108 on which tensile forces have not been exerted. The stretched state of the support 108 can be maintained by mechanical means. As a variant, the support 108 can have been stretched beyond the elastic limit. The support 108 can thus remain deformed without being maintained by external means.

The electronic device 100 comprises, for example, from 3 to 106 chips 102. The support 108 has, in the non-stretched state, for example a thickness comprised between approximately 1 μm and 1000 μm. In the stretched state, the support 108 has, for example, a thickness comprised between approximately 10 nm and 200 μm. The distance between two adjacent chips 102 is, for example, comprised between 0.5 μm and 100 cm in the non-stretched state and between 3 μm and 10 cm in the stretched state.

FIGS. 2 to 4 depict, in a partial and schematic fashion, steps of an embodiment of a method for manufacturing the electronic device 100 shown in FIG. 1. More specifically, FIG. 2 depicts views 2A, 2B and 2C of the method, FIG. 3 depicts views 3A, 3B, 3C and 3D of the method, and FIG. 4 depicts views 4A and 4B of the method.

The view 2A is a sectional view of the structure obtained after a step during which light-emitting diodes intended to be part of the optoelectronic circuit 104 are formed on a substrate 200. This step is carried out with a full wafer, i.e. the diodes of a plurality of optoelectronic circuits 104 are formed simultaneously on the substrate 200.

In the present embodiment, the light-emitting diodes have a planar structure. As a variant, the light-emitting diodes can have a three-dimensional structure as described in the U.S. Pat. No. 9,331,242.

The substrate 200 is covered by a stack of layers comprising a semiconductor layer 202, an active layer 204 and a semiconductor layer 206. The layers 202, 204, and 206 allow the formation of the light-emitting diodes. The active layer of a light-emitting diode is the layer where the bulk of the electromagnetic radiation provided by the light-emitting diode is emitted. Cavities 208, spanning completely the layers 206 and 204 and partially the layer 202, delimit the light-emitting diodes in the stack. The view 2A illustrates three units 210 of three light-emitting diodes. Each unit 210 corresponds to an optoelectronic circuit 104. Each light-emitting diode of each unit 210 is covered by a conductive pad 110 in contact with the semiconductor layer 206. Each unit 210 also comprises a conductive via 214, electrically isolated from the layers 204 and 206, establishing contact on the layer 202, and connected to a conductive pad 216. In each unit 210, the light-emitting diodes of the unit 210 are thus controlled by the voltage potentially being provided between the pads 110 and 216.

The view 2B is a sectional view of the structure obtained after a subsequent manufacturing step, carried out with a full wafer, during which electronic components, not illustrated, of a plurality of electronic circuits 106 are formed in a substrate 218. The conductive pads 112, conductive pads 217 and conductive pads 111 are formed on the substrate 218. As a variant, the substrate 218 can comprise a substantially flat face with which the conductive pads 111 are flush.

The substrates 200 and 218 are placed so as to fix, for example by molecular bonding, the pads 111 with the pads 110 and the pads 216 with the pads 217. This makes it possible to obtain the electrical connection between the electronic components of the substrate 218 and the light-emitting diodes.

The view 2C is a sectional view of the structure obtained after a subsequent step of manufacture during which the substrate 200 is etched in order to form walls 222 delimiting zones 224 located across from each light-emitting diode. These zones 224 are then filled with photoluminescent materials, thus forming photoluminescent blocks, with which it is possible, for example, to convert the radiation emitted by the light-emitting diodes into radiation with different wavelengths.

The layers 202, 204 and 206 are etched so as to separate the various units 210, thus forming the optoelectronic circuits 104.

The view 3A is an enlarged sectional view through a single chip of the structure obtained after a manufacturing step during which a handle 226 is fixed to the optoelectronic circuits 104, more specifically on the photoluminescent blocks 224 and on the walls 222, for example by means of an adhesive. An isolating layer not illustrated can cover the lateral faces of the optoelectronic circuits 104.

The view 3B is a sectional view of the structure obtained after a manufacturing step during which the substrate 218 can be thinned on the side opposite the pads 112 and is fixed on the support 108. The handle 226 is then removed.

The support 108 is made of a stretchable material, as defined in the foregoing. The support 108 is, for example, in a non-stretched state, i.e. no tensile force is exerted on the support 108.

The view 3C is a sectional view of the structure obtained after a subsequent manufacturing step. During this step, the substrate 218 is etched so as to separate the electronic circuits 106 of the various display pixels 102.

The view 3D is a top view of the support 108 during the step depicted by view 3C.

In the example shown in the view 3D, the support 108 and the unit of the display pixels 102 have substantially rectangular shapes and the unit of display pixels 102 is placed so that each of its sides forms an angle substantially equal to 45° with each side of the support 108. More generally, the support 108 can have a non-rectangular shape and can thus be, for example, stretched in directions at approximately 45° from the edges of the pixels.

The view 4A is a top view depicting the result of a subsequent manufacturing step of the electronic device. During this step, the support 108 is stretched so as to place the chips 102 at the desired locations. According to the present embodiment, the chips 102 are arranged, after the stretching step, substantially in lines and in columns.

According to an embodiment, the chips 102 can be, after the step depicted by the view 4A, transferred onto another stretchable support, which is then stretched, so as to increase the distance between the chips. This step can then be repeated a plurality of times so as to obtain the desired distance between the chips.

The view 4B is a top view depicting the result of a subsequent manufacturing step. During this step, the conductive strips 114 are formed on the support 108 and on the chips 102 in contact with the conductive pads 112. In the example shown in FIG. 4B, each pad 112 of each chip 102 is connected to a common conductive strip 114 with other chips 102 of a same line or of a same column. The conductive strips 114 are, for example formed by 3D printing. An isolating element, not illustrated, is preferably placed between the conductive strips 114, at the intersections of the conductive strips 114, so as to avoid short circuits.

The stretched state of the support 108 can be maintained by elements not illustrated.

According to a further embodiment, the support 108 can be used as a handle in an intermediate step of a method for manufacturing an electronic device. This way, the chips can be transferred onto another, for example non-stretchable, support. Such an embodiment of an electronic device is illustrated in FIG. 5.

Figure 5:
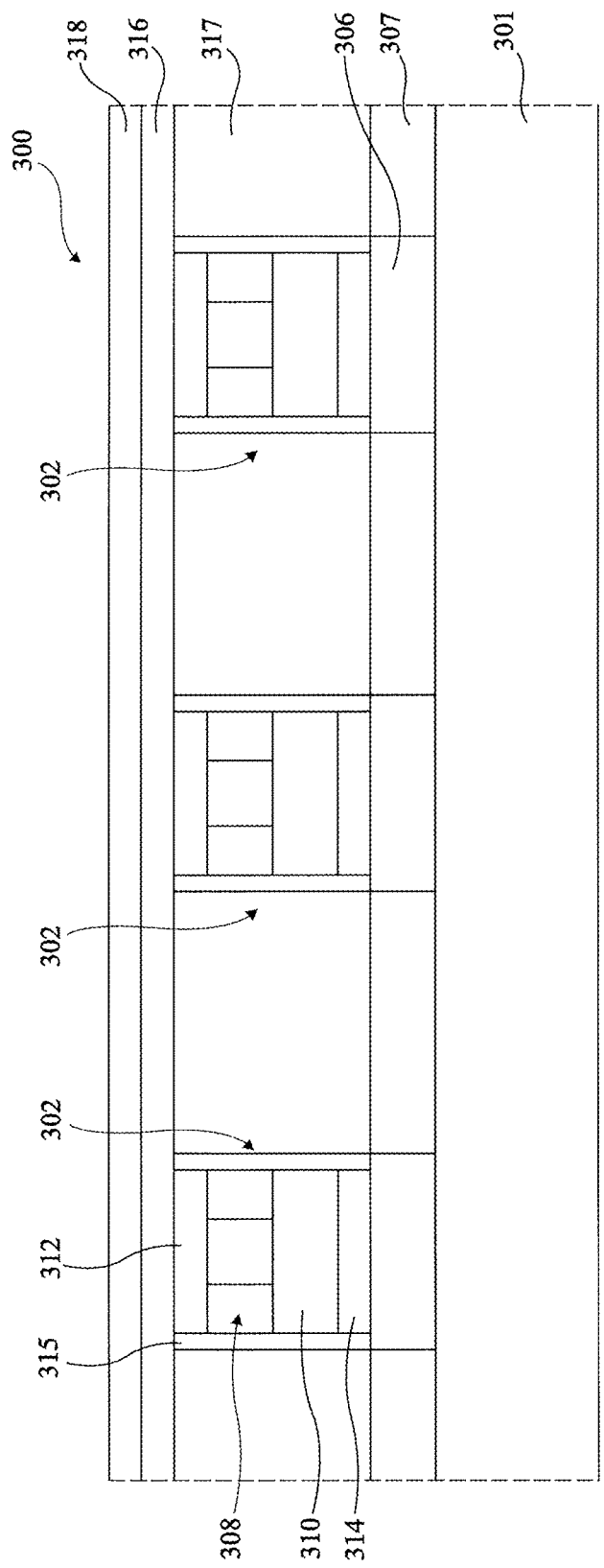
FIG. 5 is a partial and schematic sectional view of a further embodiment of an electronic device.

FIG. 5 is a partial and schematic sectional view illustrating a further embodiment of an electronic device 300.

The electronic device 300 comprises a support 301 on which chips 302 lie, here display pixels. The support 301 is preferably not stretchable. The support 301 can be rigid or flexible. Preferably, the support is black, so as to increase the contrast of the screen. It is, for example, a support made of a semiconductor material, of glass or of plastic. Conductive strips 306 are formed on the support 301. Each conductive strip can be connected to the display pixels of a same line. Three conductive strips are illustrated in FIG. 5. An isolating layer 307 separates the conductive strips 306.

The display pixels 302 each comprise here an optoelectronic circuit 308 and an electronic circuit 310. The circuits 308 and 310 are, for example, respectively similar to the optoelectronic circuit 104 and to the electronic circuit 106 described in the foregoing in relation to FIG. 1. Each display pixel 302 additionally comprises a conductive layer 312 covering the face of the optoelectronic circuit 308 opposite the electronic circuit 310 and a conductive layer 314 covering the face of the electronic circuit 310 opposite the optoelectronic circuit 308. The layer 314 is in contact with one of the conductive strips 306. Preferably, the conductive layer 312 is transparent to the radiation emitted by the optoelectronic circuit 308. The contacts of the pixel 302 with external elements are established by the layers 312 and 314. The pixel 302 thus does not have a conductive pad 112 (FIG. 1).

The conductive layers 312 and 314 constitute the sole external terminals of each display pixel 302, i.e. the sole connections between the display pixel and elements external to the display pixel.

Each pixel 302 comprises, for example, only two electrical connections, here the conductive layers 312 and 314. With each of the two electrical connections, it is possible to interconnect the pixels of a same line or of a same column.

Each display pixel 302 is surrounded by an isolating wall 315. More specifically, the lateral walls of the conductive layers 312 and 314, of the optoelectronic circuit 308 and of the electronic circuit 310 of each display pixel 302 are covered by the isolating wall 315. An isolating layer 317 surrounds the display pixels 302, the upper face of the layer 317 being, for example, substantially coplanar with the upper face of the conductive layers 312.

Conductive strips 316, a single strip 316 being illustrated, cover the display pixels 302 and the isolating layer 317. Each conductive strip 316 covers the pixels of a same column of the array of pixels and the isolating layer 317. The conductive strip 316 is in contact with the conductive layers 312 of the pixels of the column and constitutes an electrode. The display pixels of a same column are thus controlled by the voltage provided between the strip 316 and the conductive strips 306.

As a variant, the conductive strip 316 can cover chips 302 of more than one column, for example the chips of at least two columns. As a variant, a single conductive strip 316 can cover the unit of the chips 302 of the device 300.

The conductive strips 316 are preferably transparent to the radiation provided by the display pixels 302. The conductive strips 316 are preferably covered by a protective layer 318, for example made of glass. The protective layer 318 is substantially transparent to the radiation provided by the display pixels 302.

As a variant, the support 301 can be made of a flexible polymer and the protective layer 318 can be made of a flexible plastic.

Figure 6:
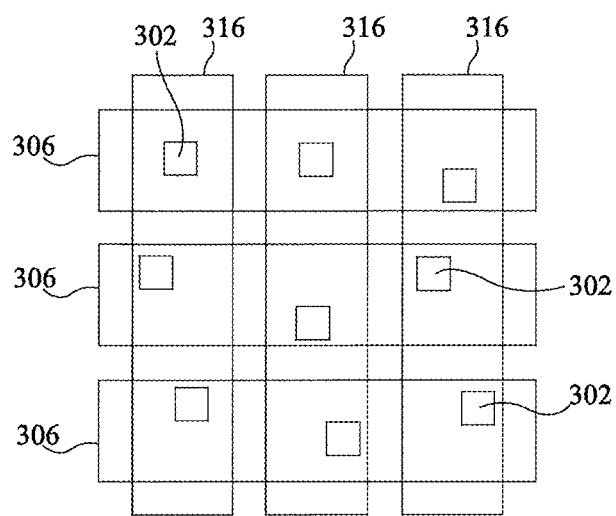
FIG. 6 illustrates a partial and schematic top view of the embodiment shown in FIG. 5.

FIG. 6 illustrates a partial and schematic top view of the embodiment of the device 300 shown in FIG. 5. The conductive strips 306 are substantially parallel. The conductive strips 316 are also substantially parallel and extend perpendicularly to the conductive strips 306. Each display pixel 302 is illustrated by a square. The display pixels 302 are located at the intersections of the conductive strips 306 and 316.

The conductive strips 306 and 316, advantageously have larger dimensions than those of the display pixels 302 for connecting the display pixels 302 of the corresponding line or column even in cases where, as in FIG. 6, the pixels 302 are not perfectly aligned.

FIG. 7 comprises partial and schematic sectional views depicting steps of an embodiment of a method for manufacturing the electronic device 300 shown in FIG. 5.

The view 7A depicts the result of manufacturing steps during which a wafer of chips 302, each comprising the conductive layers 312 and 314, the optoelectronic circuit 308 and the electronic circuit 310, is formed and is then transferred onto a stretchable support 400, for example by means of a handle not illustrated which is then removed. The chips 302 are then individualised and the isolating walls 315 are formed on the lateral walls of the chips 302.

The view 7B depicts the result of a subsequent manufacturing step during which the support 400 was stretched so as to place the chips 302 at the desired places. The isolating layer 317 is deposited around the chips 302. The isolating layer 316 is formed on the chips 302 and on the layer 317. The layer 316 is formed so as to be in contact with the conductive layers 312. The protective layer 318, for example made of glass, is fixed to the layer 316, for example by means of an adhesive.

The view 7C depicts the result of a subsequent manufacturing step during which the support 400 is removed. The conductive strips 306 are formed in contact with the conductive layers 314. The conductive strips 306 are surrounded by the isolating layer 307.

Steps not illustrated are then carried out in order to obtain the embodiment shown in FIG. 5. During these steps, the display pixels 302 are deposited on the support 301.

As a variant, the isolating layer 307 may cover only the lateral walls of the conductive strips 306, and not cover the support 300 entirely. The isolating layer 307 is thus not continuous. In this variant, the support 301 is, for example, made of a material that is black and isolating at least at the surface. Thus, the portions of the black support 301 potentially being observed through the discontinuities in the layer 307 allow a better contrast in cases where the device is a display screen.

Figure 8:
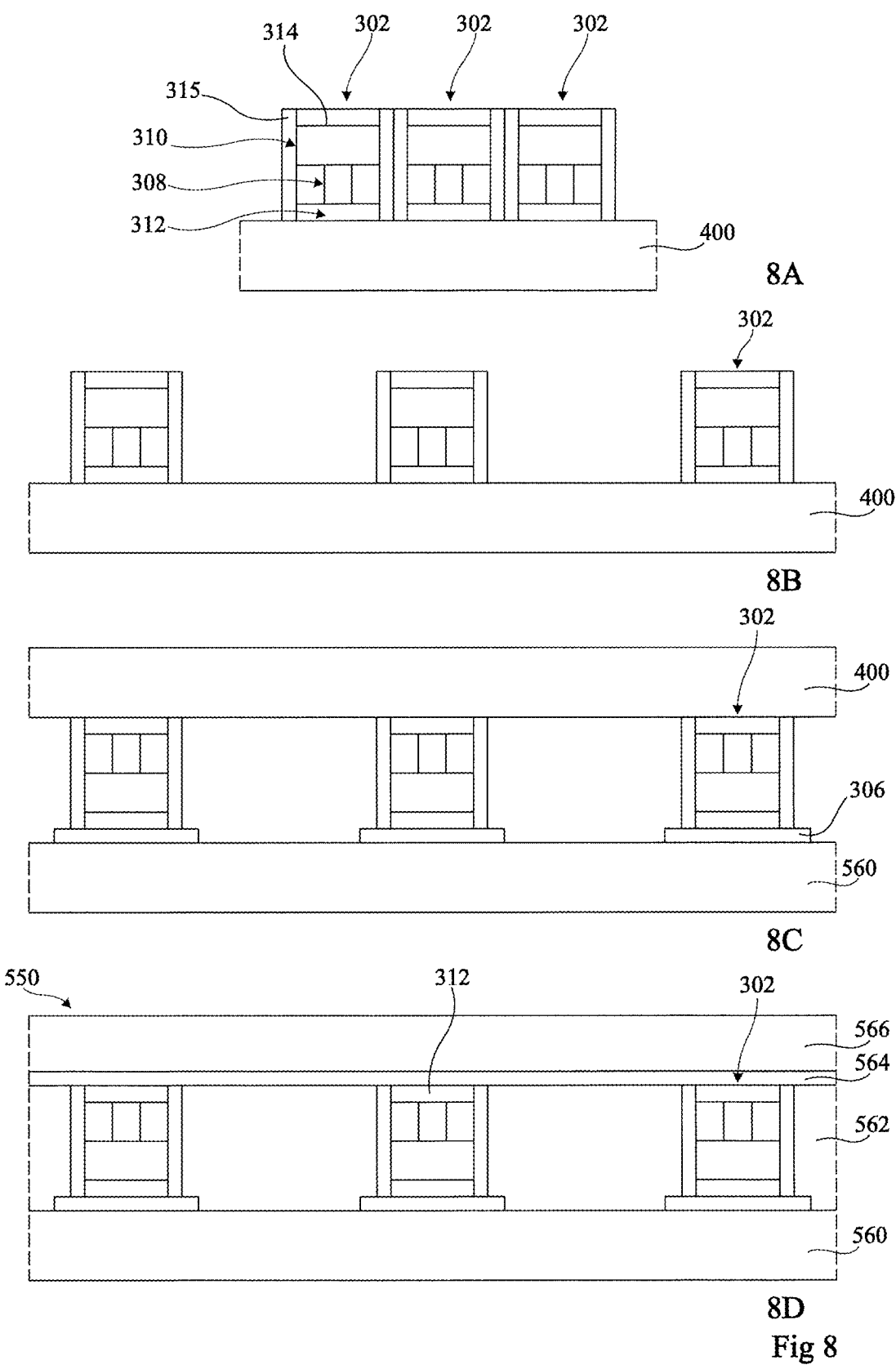
FIG. 8 illustrates partial and schematic sectional views depicting further steps of an embodiment of a method for manufacturing a further embodiment of an electronic device.

FIG. 8 comprises partial and schematic sectional views depicting steps of an embodiment of a method for manufacturing the device 550, which is similar to the device illustrated in FIG. 5.

The view 8A depicts the result of manufacturing steps, similar to the steps described in relation to view 6A of FIG. 6, during which a wafer of chips 302, each comprising the conductive layers 312 and 314, the optoelectronic circuit 308 and the electronic circuit 310, is formed and is then transferred onto a stretchable support 400, for example by using a handle not illustrated. According to an example described in relation to FIG. 8, the support 400 is located on the side of the optoelectronic circuit 308, i.e. in contact with the conductive layer 312 of each chip 302. The chips 302 are then individualised and the isolating walls 315 are formed on the lateral walls of the chips 302.

The view 8B depicts the result of a subsequent manufacturing step during which the support 400 was stretched so as to place the chips 302 at the desired places.

The view 8C depicts the result of a step during which the display pixels 302 are transferred onto conductive strips 306 located on a support 560. The support 560 is preferably a non-elastic rigid support or a supple support. The support 560 is, for example, made of a black material.

The view 8D depicts the result of a step during which the stretchable support 400 is removed. The display pixels 302 are then surrounded by an isolating layer 562 covering the support 560 around the display pixels 302. The upper face of the isolating layer 562 is, for example, coplanar with the upper face of the conductive layer 312.

Conductive layers 564 are formed on the display pixels 302 and on the isolating layer 562 so as to connect together the conductive layers 312 of the pixels of a same column. The layers 564 are preferably substantially transparent to the radiation emitted by the display pixels 302.

A protective layer 566, for example made of glass, is then formed on the conductive layers 564 and on the parts of the isolating layer 562 not covered by the conductive layers 564. The protective layer 566 is preferably substantially transparent to the radiation emitted by the display pixels 302.

Figure 9:
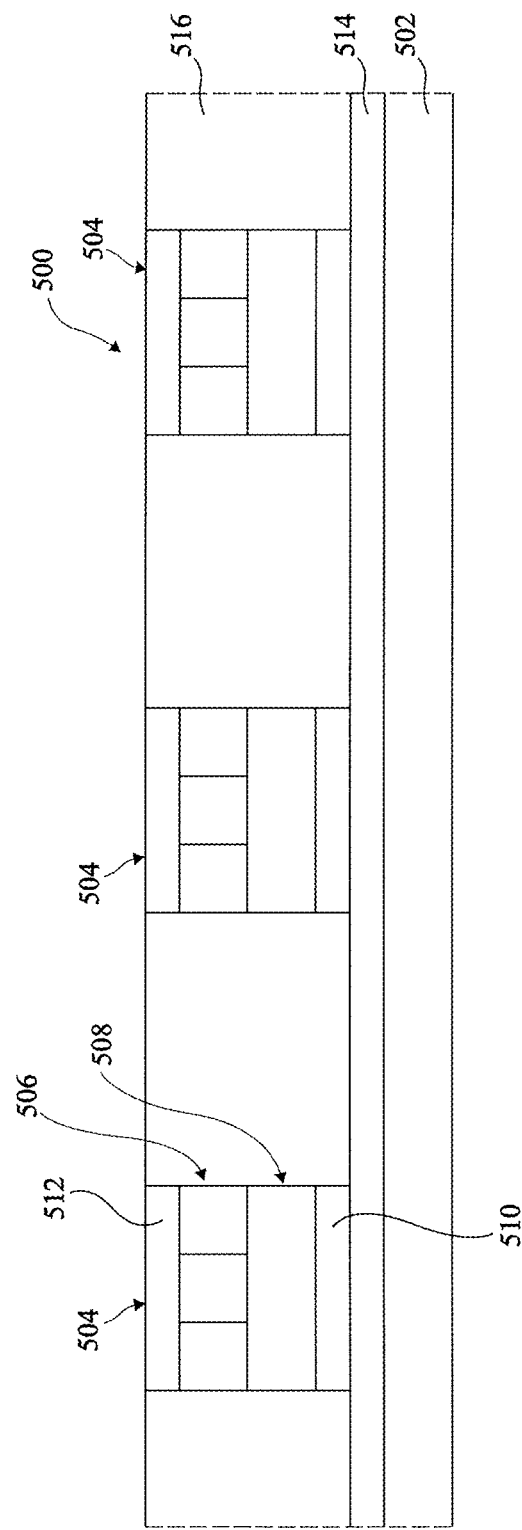
FIG. 9 is a partial and schematic sectional view of a further embodiment of an electronic device.

FIG. 9 depicts a further embodiment of an electronic device 500. The electronic device 500 comprises, like the electronic device 100 shown in FIG. 1, a stretchable support 502, as defined in the foregoing. The electronic device 500 additionally comprises a plurality of chips 504, three of which are illustrated here, similar to the chips 302 shown in FIG. 3. Thus, the chips 504 are display pixels each comprising an optoelectronic circuit 506, similar to the optoelectronic circuit 308, an electronic circuit 508, similar to the electronic circuit 310, and conductive layers 510 and 512 respectively similar to the conductive layers 314 and 312.

Conductive elements 514 are located on the support 502. The conductive elements 514 comprise, for example, conductive pads in contact with the conductive layers 510, and conductive strips connecting pads together. Each conductive element connects, for example, the display pixels of a line of pixels. An isolating layer 516 is located around the chips 504.

The conductive elements 514 are at least partially stretchable or deformable. For example, the conductive pads are not stretchable and the conductive strips are stretchable.

Conductive elements not illustrated, for example conductive strips, can be formed on the layer 516 so as to connect together certain conductive layers 512, for example the conductive layers 512 of the display pixels of a column of display pixels.

FIGS. 10 and 11 depict, in a partial and schematic fashion, steps of an embodiment of a method for manufacturing the stretchable conductive elements 514. More precisely, FIG. 10 depicts views 10A and 10B and FIG. 11 depicts views 11A, 11B and 11C.

The views 10A and 10B are respectively a top view and a sectional view depicting the result of a manufacturing step. During this step, a conductive layer is deposited on a substrate 800. In the described example, the conductive layer is separated from the substrate 800 by an isolating layer 802. The conductive layer is etched so as to form conductive pads 804 and conductive strips 806. A single conductive pad 804 and two conductive strips 806 are illustrated in FIGS. 10 and 11.

In the example shown in FIGS. 10A and 10B, the thickness of the conductive pads 804 is greater than the thickness of the conductive strips 806. For instance, the thickness of the conductive strips 806 varies from 1.01 to 10 times the thickness of the conductive pads 804 and the thickness of the conductive pads 804 is comprised between 20 nm and 1 mm.

As a variant, the conductive pads 804 and the conductive strips 806 can have the same thickness. For example, the stretchable support can thus comprise cavities at the locations of the conductive strips, so that the conductive strips 806 are not in contact with the stretchable support.

The conductive pads 804 are intended to be connected to chips. The conductive strips 806 are in contact with at least one conductive pad 804 and are adapted to electrically connect the pads 804 to one another or to other conductive elements not illustrated. According to an embodiment, each conductive strip 806 has a zigzag shape and is coupled at at least one end to a conductive pad 804.

The etching of the conductive layer is, for example, carried out by forming a mask, not illustrated, formed in a plurality of steps on the conductive layer. The mask comprises zones having a first thickness at the locations where the conductive pads 804 will be formed, zones having a second thickness at the locations where the conductive strips 806 will be formed and a third thickness elsewhere. The third thickness corresponds, for example, to a complete etching of the mask.

The mask is, for example, made of silicon oxide. The conductive pads 804 and the conductive strips 806 are, for example, made of metal, for example of aluminium. The substrate 800 is, for example, made of silicon and has, for example, a thickness of approximately 750 µm. The isolating layer 802 is, for example, made of a polymer, in particular a polymer formed by spin deposition.

The view 11A is a sectional view depicting the result of a subsequent manufacturing step. During this step, a stretchable support 900, similar to the support 400 or to the support 108, is fixed to the conductive pads 804, for example by means of an adhesive, for example by a blue adhesive masking material, generally known by the name "blue tape".

The thickness of the conductive strips 806 is less than the thickness of the conductive pad 804 so that the strips 806 are not in contact with the stretchable support 900.

The view 11B depicts the result of a subsequent manufacturing step. During this step, the substrate 800, as well as the layer 802, are completely removed, so as to uncover the conductive pads 804 and the conductive strips 806. A wafer 902, comprising, for example, a wafer 904 of electronic circuits similar to the electronic circuits 310 or 508, and a wafer 906 of optoelectronic circuits similar to the optoelectronic circuits 308, 506, is deposited in contact with the conductive pads 804 and the conductive strips 806. The wafer 902 also comprises, for example, conductive pads 908 located between the wafer 904 and the pads 804.

The view 11C depicts the result of a manufacturing step during which the wafer 902 is etched so as to retain only the chips. More specifically, the portions of the wafer 902 located across from the conductive strips 806 are etched. Thus, when the support 800 is removed, the conductive strips 806 are only maintained by their contact with the pads 804 and can thus be deformed.

Figure 12:
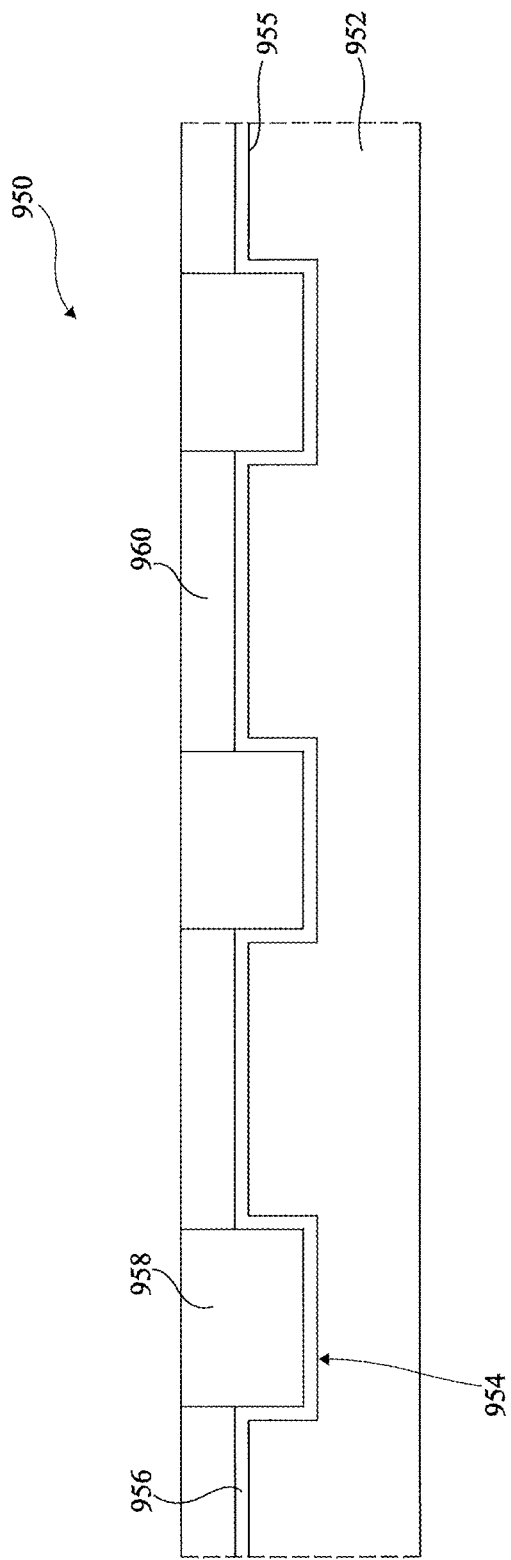
FIG. 12 is a partial and schematic sectional view of a further embodiment of an electronic device.

FIG. 12 is a sectional view depicting a further embodiment of an electronic device 950.

The device 950 comprises a stretchable support 952 in a stretched state. The stretchable support 952 comprises cavities 954 formed from the face 955 of the support 952. Conductive elements 956 can be located on a part of the face 955 and in the cavities 954.

Chips 958, for example display pixels, are at least partially located in the cavities 954. More specifically, a part of each chip 958 is, for example, located in a cavity 954 and is in contact with a part of a conductive element 956 and another part of each chip is, for example, located outside the cavity 954. The conductive elements 956 thus make it possible to connect a plurality of chips 958 electrically. In the example shown in FIG. 10, the three chips illustrated are connected by the same conductive element 956.

The conductive elements 956 are, for example, at least partially stretchable and/or deformable. For example, the parts of the conductive elements 956 located in the cavities 954 are not stretchable or deformable, and the parts of the conductive elements 956 located on the face 955 of the support 952 are stretchable and/or deformable. The parts of the conductive elements 956 located on the face 955 are, for example, similar to the conductive strips 806 described in the foregoing in relation to FIGS. 8 and 9 and are thus not fixed to the face 955 of the support 952.

The part of the chips 958 located outside the cavities 954 are surrounded by an isolating layer 960. The isolating layer 960 is, for example, formed so as to leave a face of each chip 958 uncovered.

FIG. 13 depicts, in a partial and schematic fashion, steps of an embodiment of a method for manufacturing the electronic device 950 shown in FIG. 12. More specifically, FIG. 11 depicts views 13A, 13B and 13C of the manufacturing method.

The view 13A depicts a manufacturing step during which the cavities 954 are etched in the support 952. The support 952 is thus preferably in a non-stretched state.

The conductive elements 956 are then formed. For example, a conductive layer can be formed on the face 955 and on the walls and on the bottom of the cavities 954, then etched so as to form the conductive elements 956. The conductive elements 956 are, for example, formed in two steps: a step during which the bottom and the walls of the cavities are covered by a conductive layer and a step during which deformable, stretchable conductive elements are formed on the face 955, for example by implementing a lift-off method using a sacrificial layer placed between the conductive elements 956 and the face 955.

The view 13B depicts a subsequent manufacturing step during which the chips 958 are placed in the cavities 954, in contact with the conductive elements 956.

The chips 958 are, for example, formed in a same wafer. A handle 962 is then bonded to the wafer. The various chips 958 are then individualised. The distance between the various chips 958 is the same as the distance between the various cavities 954 when the support 952 is not stretched. This way, it is possible to place all of the chips 958 in the cavities 954 simultaneously.

In cases where each chip comprises an electronic circuit and an optoelectronic circuit, the electronic circuit is on the side of the conductive elements 956 and the optoelectronic circuit is on the side of the handle 962.

The view 13C depicts a subsequent manufacturing step during which the handle 962 is removed and the support 952 is stretched. The stretchable and/or deformable parts of the conductive elements 956 are thus stretched and/or deformed at the same time as the support 952.

The manufacturing method can comprise subsequent steps not illustrated, for example the formation of the layer 960 around the chips 958.

An advantage of the manufacturing method embodiments described in the foregoing is that they make it possible to obtain electronic devices comprising a plurality of chips more rapidly and at a reduced cost compared to conventional methods.

Various embodiments and variants have been described. These various embodiments and variants can be combined and other variants will occur to those skilled in the art. In particular embodiments in which the chips are display pixels have been described here. However, the chips can correspond to any type of electronic chips that one desires to place on a same support, for example sensors such as photodetectors. Finally, the practical implementation of the embodiments and variants described herein is within the capabilities of those skilled in the art based on the functional description provided hereinabove.

The invention claimed is:

1. A method for manufacturing an electronic device comprising the following steps:
   a) forming a wafer comprising a plurality of electronic chips;
   b) fixing the wafer of electronic chips to a first support made of a stretchable material;
   c) removing and/or etching the wafer; and
   d) stretching the first support so as to move the chips away from one another,
   further comprising the formation of second conductive elements on the side of the chips opposite the first support and/or above the chips.

2. The method according to claim 1, comprising, before step b), a step of forming first conductive elements on the first support.

3. The method according to claim 2, wherein the first conductive elements are stretchable and/or deformable.

4. The method according to claim 2, wherein the formation of the first conductive elements comprises the following steps:
   forming a conductive layer on a substrate;
   etching the conductive layer so as to form first conductive elements, the first conductive elements comprising pads and strips in a zigzag pattern, each strip being in contact with at least one pad; and
   transferring the pads and the strips onto the first support so that the strips are not in contact with the first support.

5. The method according to claim 4, wherein the thickness of the strips is less than the thickness of the pads.

6. The method according to claim 1, comprising, before step b), the formation of cavities in the first support, each chip being located in one of the cavities after step b).

7. The method according to claim 1, wherein the formation of the second conductive elements is carried out after step d).

8. The method according to claim 1, comprising a step, after step d), of transferring chips from the first support onto a second support.

9. The method according to claim 1, wherein each electronic chip comprises an optoelectronic circuit and an electronic circuit adapted to control the optoelectronic circuit.

10. The method according to claim 1, wherein each electronic chip only comprises two external electronic connection terminals.

11. The method according to claim 1, comprising the following steps subsequent to step d):
   e) forming, on the side of the light-emitting face, conductive elements, substantially transparent to the radiation emitted by the chips so as to interconnect lines of chips;
   f) transferring the chips onto a third support substantially transparent to the radiation emitted by the chips;
   g) removing the first support;
   h) forming conductive layers so as to interconnect columns of chips.

12. The method according to claim 11 comprising after step h), a step of transferring chips from the third support onto a fourth support.

13. The method according to claim 1, wherein the first support comprises first conductive elements forming lines, each chip being connected, in step b), to one of the conductive elements.

14. The method according to claim 13, wherein second conductive elements forming columns are formed on the face of the chips opposite the first support.

15. An electronic device obtained by the method according to claim 1, wherein the electronic chips are located on the conductive elements, the conductive elements lying on the first support made of a stretchable material in a stretched state.

16. The device according to claim 15, wherein each electronic chip is a display pixel.

17. The device according to claim 15, wherein the device corresponds to a display screen.

18. The device according to claim 15, wherein each electronic chip comprises a conductive pad electrically connected to the conductive element lying on the first support.

19. The device according to claim 15, wherein the conductive elements are stretchable and/or deformable.

20. The device according to claim 15, wherein each electronic chip is located at least partially in a cavity of the support.

\* \* \* \* \*